(12) United States Patent
Sawada

(10) Patent No.: US 7,368,819 B2
(45) Date of Patent: May 6, 2008

(54) MULTILAYER PRINTED WIRING BOARD AND MULTILAYER PRINTED CIRCUIT BOARD

(75) Inventor: Yasuhiro Sawada, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 58 days.

(21) Appl. No.: 11/134,426

(22) Filed: May 23, 2005

(65) Prior Publication Data

US 2005/0263884 A1 Dec. 1, 2005

(30) Foreign Application Priority Data

May 27, 2004 (JP) ............................. 2004-156991
May 13, 2005 (JP) ............................. 2005-141087

(51) Int. Cl.
*H01L 23/023* (2006.01)
(52) U.S. Cl. ..................... 257/737; 257/776; 257/698; 257/703; 257/700; 257/738; 257/689; 257/E23.069
(58) Field of Classification Search ................ 257/776, 257/698, 703, 700, 737, 738, 689, E23.069
See application file for complete search history.

(56) References Cited

U.S. PATENT DOCUMENTS 6,429,114 B1 * 8/2002 Hayama et al. ............. 438/616

6,749,927 B2 * 6/2004 Cooray ....................... 428/209

FOREIGN PATENT DOCUMENTS

JP          5-343820        12/1993
JP          2002-100880     4/2002

* cited by examiner

*Primary Examiner*—Lynne Gurley
*Assistant Examiner*—Junghwa Im
(74) *Attorney, Agent, or Firm*—Fitzpatrick, Cella, Harper & Scinto

(57) ABSTRACT

In a multilayer printed wiring board having a plurality of laminated resin layers, a plurality of wiring patterns formed on the interfacial surface of the resin layers, and a plurality of lands formed on the outermost layer of the resin layers and on which the solder is provided, at least one of the wiring patterns has a plurality of openings in the form of a mesh, the size of openings of the wiring patterns in a region corresponding to the position of solder in which a stress generated in the solder provided on the lands becomes a value larger than a desired value due to thermal deformation of the semiconductor device and the multilayer printed wiring board is larger than that of openings in the other regions.

3 Claims, 4 Drawing Sheets

MULTILAYER PRINTED WIRING BOARD AND MULTILAYER PRINTED CIRCUIT BOARD

BACKGROUND OF THE INVENTION

1. Field of the Invention

The present invention relates to a wiring pattern of a multilayer printed wiring board mounting a semiconductor device.

2. Related Background Art

A printed circuit board in which a semiconductor device is mounted on a printed wiring board has been used so far for various products. Because wirings of a printed wiring board are increased in density, the BGA method and the CSP method for connecting a semiconductor device with a printed wiring board by a plurality of solder balls arranged like an array have been frequently used. Moreover, a multilayer printed wiring board is generally used.

It is requested for a solder ball for connecting a semiconductor device with a printed wiring board to keep a desired joint strength. To keep the joint strength, it is necessary to minimize a relative deformation between the printed wiring board and the semiconductor device.

However, the printed wiring board is exposed to a high temperature of 200° C. or higher in a heating-cooling process such as a solder reflow process. Moreover, the coefficient of thermal expansion of epoxy resin or glass epoxy resin for forming the printed wiring board is larger than the coefficient of thermal expansion of an IC chip comprising silicon forming a semiconductor device by approximately 10 times. Therefore, in the solder reflow process, the elongation of the printed wiring board becomes larger than the elongation of a semiconductor device including an IC chip having a small coefficient of thermal expansion. Because of the difference between the coefficients of thermal expansion, the printed wiring board greatly warps and thereby, a large stress is applied to a solder ball. Therefore, a crack occurs on the solder ball or the joint between the semiconductor device and the printed wiring board is disconnected.

As a means for reducing the warp, it is known to minimize the coefficient of thermal expansion of the printed wiring board. Japanese Patent Application Laid-Open No. 2002-100880 (Patent Document 1) discloses a method for preventing the warp of a multilayer printed wiring board due to thermal expansion and reducing a stress applied to a solder joint portion. That is, a plurality of lands are formed on the surface of a multilayer printed wiring board, a semiconductor device is mounted by solder, and a solid ground layer made of a metal, such as copper, of an inner layer of the multilayer printed wiring board is formed by punching a circular or hexagonal continuous pattern. Thereby, the thermal expansion coefficient of the printed wiring board is decreased and the warp of the printed wiring board is prevented.

Moreover, Japanese Patent Application Laid-Open No. H05-343820 (Patent Document 2) discloses that a solid ground layer of an inner layer of a printed wiring board as in Patent Document 1 is formed into a shape a continuous pattern of a circle or polygon such as a hexagon obtained by punching. Moreover, its purpose is to adjust the characteristic impedance of a signal wiring set to a wiring layer adjacent to the ground layer. That is, the characteristic impedance value of the signal wiring set to the adjacent wiring layer is adjusted in accordance with the size or shape of a circular or hexagonal continuous pattern. Thereby, it is possible to realize impedance matching of a wiring and obtain the propagation characteristic of a high-speed stable electric signal.

In recent years, because a product is downsized and has an advanced function, the wiring of a printed wiring board is further increased in density and the size of a solder ball for connecting a semiconductor device with the printed wiring board is further decreased. Therefore, how to maintain a joint strength by small solder ball is a large problem. Moreover, the thickness of a printed wiring board is decreased and the number of wiring pattern layers made of a metal such as a copper foil is increased. Therefore, the coefficient of thermal expansion and the stiffness of a printed wiring board are raised and the difference between coefficients of thermal expansion of a semiconductor device and a printed wiring board is increased.

In the case of a method for forming a continuous pattern of a circle or polygon such as a hexagon on a solid ground layer of an inner layer disclosed in Patent Documents 1 and 2, to stabilize the wiring impedance of the whole wiring layer, it is effective to minimize the size of the continuous pattern of circle or polygon such as a hexagon. However, when the size of the continuous pattern of circle or polygon such as a hexagon is decreased, the coefficient of thermal expansion of a printed wiring board increases and the above problem of warp is actualized.

SUMMARY OF THE INVENTION

It is an object of the present invention to provide a multilayer printed wiring board capable of reducing the stress of the solder joint portion with a semiconductor device generated due to thermal expansion and stabilizing the impedance of a wiring.

To achieve the above object, a multilayer printed wiring board of the present invention has a plurality of laminated resin layers, a plurality of wiring patterns formed on a interfacial surface between the resin layers, and a plurality of lands which are formed on an outermost layer of the resin layers and on which a solder is provided. At least one layer of the wiring patterns has a plurality of openings in the form of a mesh, and a size of the openings of the wiring patterns in a region corresponding to a solder position at which a stress generated in the solder provided on the lands due to thermal deformation of a semiconductor device and the multilayer printed wiring board becomes larger than a desired value is smaller than a size of the openings in the other regions.

Moreover, in a multilayer printed wiring board of the present invention, the wiring patterns having a plurality of openings in the form of a mesh are wiring patterns adjacent to the outermost layer of the resin layers on which the lands are formed.

Furthermore, in a multilayer printed wiring board of the present invention, the lands are formed in the form of an array and the region corresponding to a solder position where the generated stress becomes larger than a desired value is a region located at four corners of the lands.

Furthermore, in a multilayer printed wiring board of the present invention, the semiconductor device includes an IC chip sealed in a package, and the region corresponding to a solder position at which the generated stress becomes larger than a desired value is a region located at four corners of the lands and a region located at four corners of the IC chip.

The above and other objects, features, and advantages of the invention will become more apparent from the following detailed description taken in conjunction with the accompanying drawings.

DESCRIPTION OF THE PREFERRED EMBODIMENTS

Embodiments of the present invention are described below by referring to the accompanying drawings.

Embodiment 1

Figure 1:
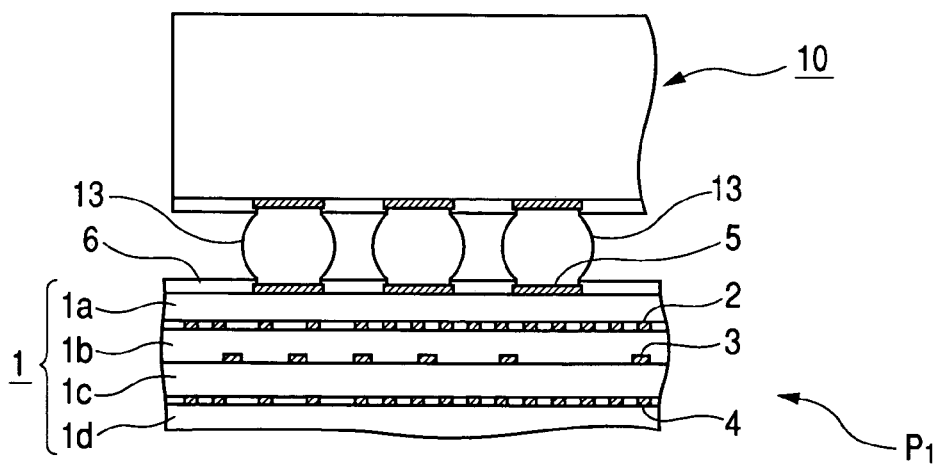
FIG. 1 is a schematic view of a multilayer printed wiring board of Embodiment 1.

FIG. 1 is a sectional view of a multilayer printed wiring board of the Embodiment 1. In FIG. 1, a multilayer printed wiring board $P_1$ is formed of laminated four resin layers 1a, 1b, 1c, and 1d. A first wiring pattern 2 is formed on the interfacial surface between the first resin layer 1a and the second resin layer 1b, a second wiring pattern 3 is formed on the interfacial surface between the second resin layer 1b and the third resin layer 1c, and a third wiring pattern 4 is formed on the interfacial surface between the third resin layer 1c and the fourth resin layer 1d. The first wiring pattern 2 is a ground layer, the second wiring pattern 3 is a signal wiring layer, and the third wiring pattern 4 is a power supply layer. The resin layers 1a, 1b, 1c, and 1d are respectively formed of a glass epoxy resin obtained by reinforcing an epoxy resin with glass cloth.

Moreover, a plurality of lands 5 are formed on the surface of the first resin layer 1a in the form of an array and a solder resist 6 for insulation is applied to portions other than surfaces of the lands 5. The lands 5 are electrically connected through a semiconductor device 10 and a plurality of solder balls 13. The wiring patterns 2, 3, and 4 are connected to the lands 5 formed on the surface of the multilayer printed wiring board $P_1$ through wirings not illustrated.

Figure 2A:
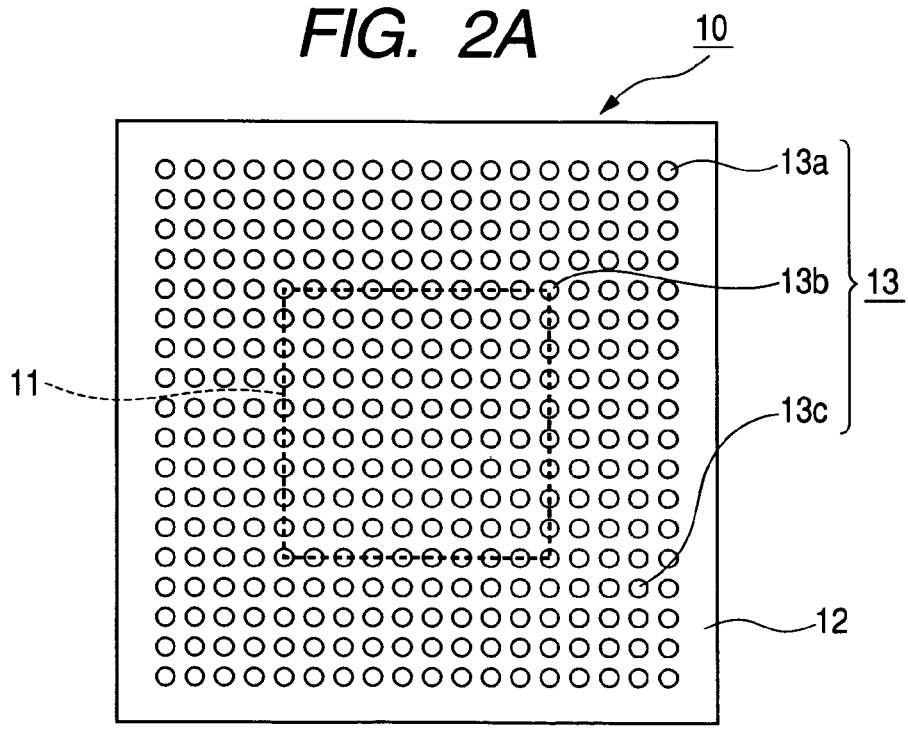
FIGS. 2A and 2B are schematic views of a semiconductor device of the Embodiment 1.
Figure 2B:
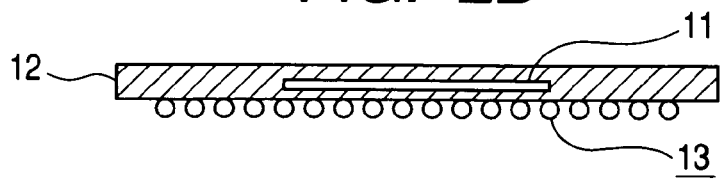

FIGS. 2A and 2B are conceptual views of a semiconductor device 10 mounted on the multilayer printed wiring board $P_1$ shown in FIG. 1. FIG. 2A is a top view of the device 10 viewed from the solder ball 13 side and FIG. 2B is a sectional view of the device 10. In FIGS. 2A and 2B, reference numeral 11 denotes an IC chip which is sealed with a package 12 made of an epoxy resin. A plurality of solder balls 13 are formed at the bottom surface of the package 12 in the form of an array. The IC chip is formed of silicon, the package 12 is formed of an epoxy resin, and the solder balls are formed of a lead-free solder.

Figure 3:
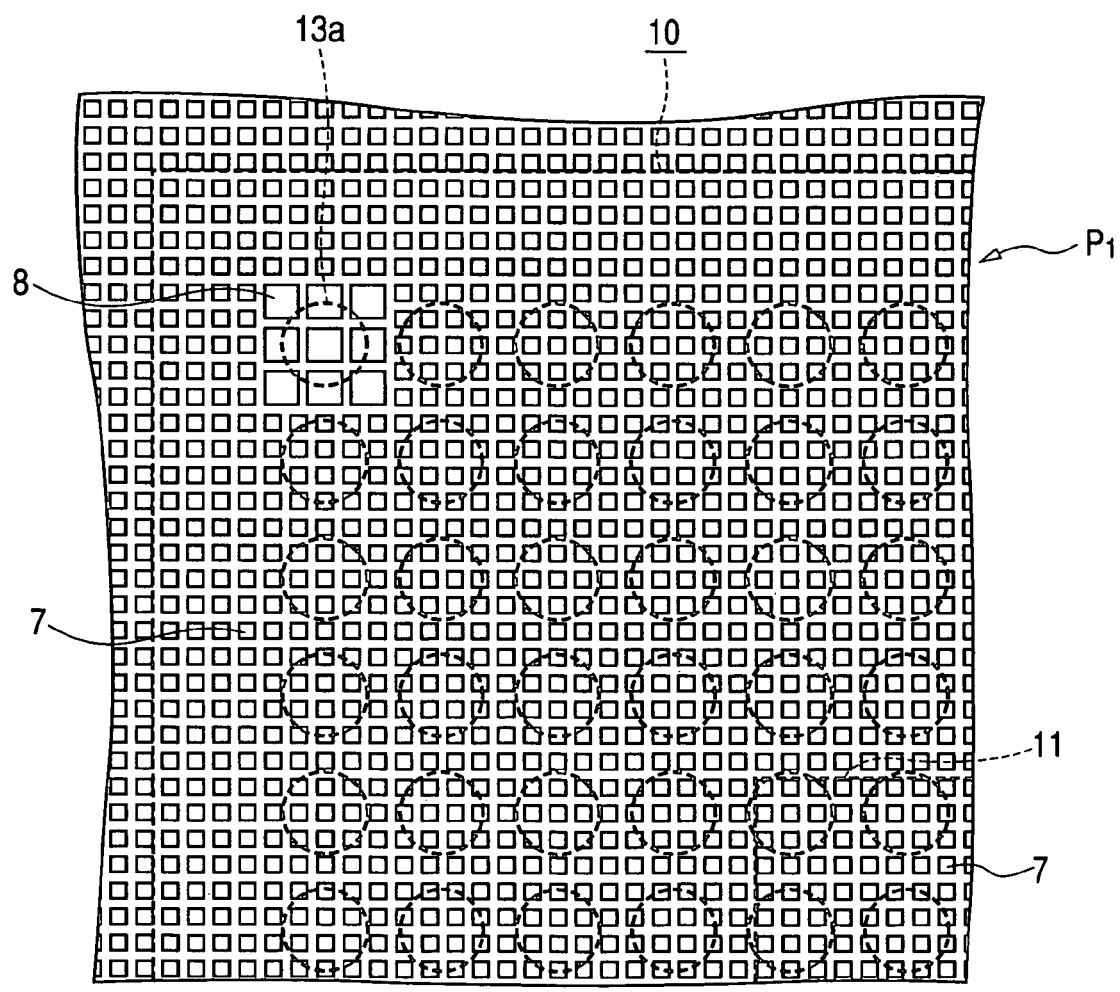
FIG. 3 is a top view showing a ground layer of the multilayer printed wiring board of the Embodiment 1.

FIG. 3 is a top view obtained by enlarging a part of the first wiring pattern 2 of the multilayer printed wiring board shown in FIG. 1. To simplify the description, the contour of the semiconductor device 10 and positions of the solder balls 13 are shown by a dotted line. A plurality of rectangular openings are formed on the first wiring pattern 2 in the form of a mesh.

Normally, a place on which stresses generated due to thermal expansion of a multilayer printed wiring board are concentrated can be previously determined in accordance with the arrangement of a multilayer printed wiring board, semiconductor device, and solder balls. Therefore, by lowering the thermal expansion coefficient of the printed wiring board at the place on which stresses are concentrated, stress concentration is eliminated and a crack does not occur on a joint portion.

In the solder balls arranged in the form of an array shown in FIG. 3, a joint portion where a stress is maximized due to thermal expansion is a solder ball located at four corners of the arrayed solder balls. Therefore, the solder balls located at four corners of the arrayed solder balls are formed of a mesh pattern constituted of an opening 8 having a large opening area. Moreover, other regions are formed of a mesh pattern constituted of an opening 7 having a small opening area. Thereby, it is achieved to decrease only the thermal expansion coefficient nearby the opening 8 having a large opening area of a multilayer printed wiring board.

Furthermore, the region where the opening 8 having a large opening area is formed is very small compared to the region where the opening 7 having a small opening area is formed. Therefore, for the first wiring pattern 2 as a whole, the characteristic impedance is stabilized, so that it is possible to stably keep the wiring impedance on the adjacent second wiring pattern 3.

A wiring pattern to be formed by a mesh pattern is not restricted to the first wiring pattern 2 of the multilayer printed wiring board $P_1$. It is also allowed to use the second wiring pattern 3 or third wiring pattern 4. Moreover, it is allowed to use not only a ground layer but also a power supply layer or another signal wiring layer.

The mesh size of the first wiring pattern 2 is preferably such that the size of the square hole of the opening 8 having a large opening area is 1.5 to 3 times larger than that of the opening 7 having a small opening area. It is preferable that the size of the square hole of the opening 7 is about 0.2 mm×0.2 mm square, and that of the opening 8 is about 0.4 mm×0.4 mm square. In this case, it is possible to form twenty-five openings 7 and nine openings 8 in an area of 1.4 mm×1.4 mm square. That is, the area of the first wiring pattern 2 is about ½ for the opening 7 and about ⅓ for the opening 8 compared to the case of a conductive material whose whole surface is solid. The thermal expansion coefficient of the first wiring pattern 2 made of a metal such as copper is proportional to the area of the metal. The thermal expansion coefficient of the first wiring pattern 2 corresponding to solder balls located at four corners of an arrayed solder ball on which the opening 8 is formed is about ⅓ compared to a solid ground. Thereby, it is possible to moderate joint stresses applied to the solder balls located at four corners.

Embodiment 2

Figure 4:
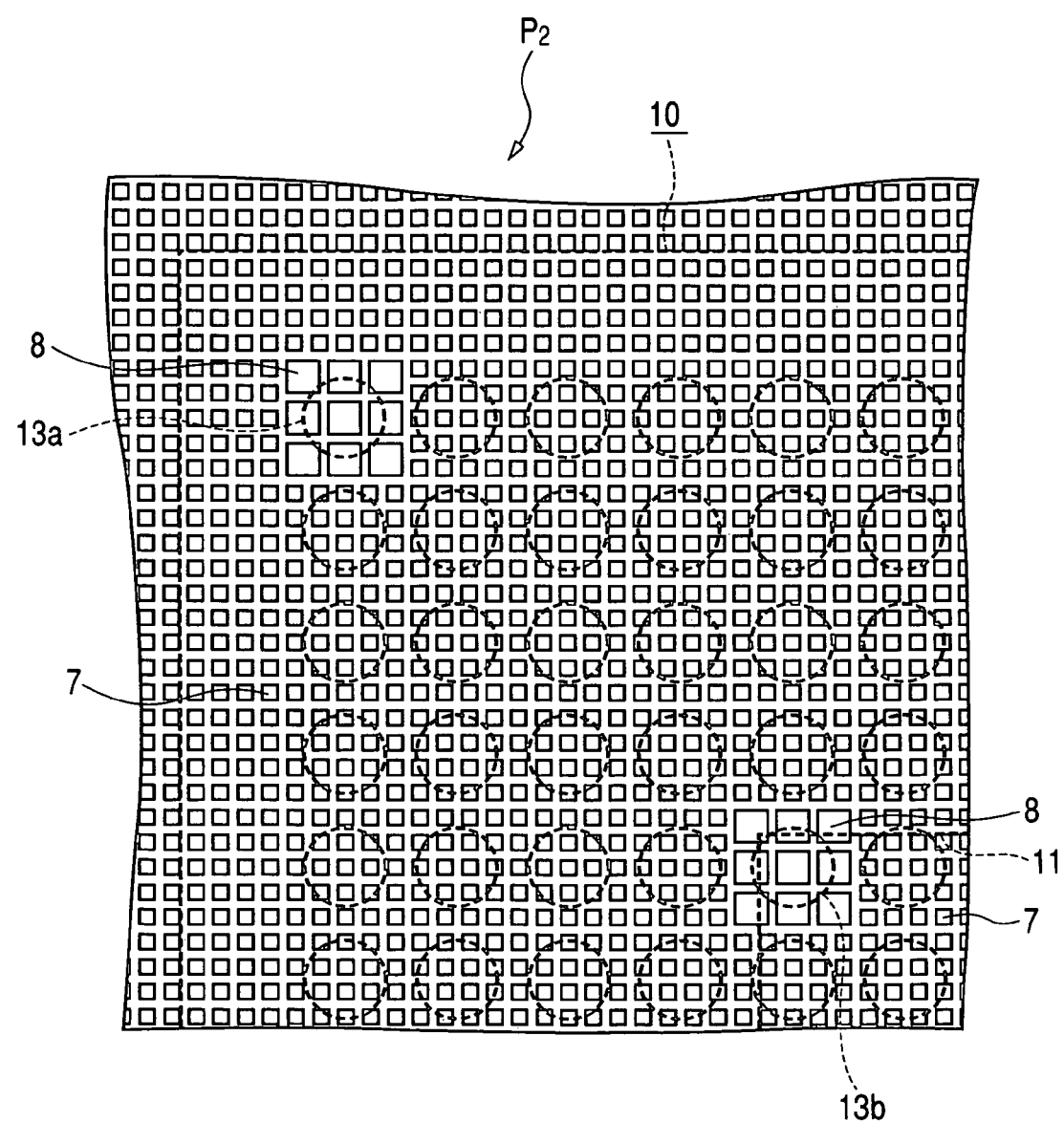
FIG. 4 is a top view showing a ground layer of a multilayer printed wiring board of Embodiment 2.

FIG. 4 is a top view showing a first wiring pattern 2 of a multilayer printed wiring board $P_2$ of the Embodiment 2. To simplify the description, the contour of a semiconductor device 10, contour of an IC chip 11, and position of a solder ball 13 are shown by a dotted line. Rectangular openings are formed on the first wiring pattern 2 in the form of a mesh.

In FIG. 4, a joint portion where a maximum stress due to thermal expansion is generated is a solder ball 13a located at four corners of the solder balls arranged in the form of an array on the semiconductor device 10 shown in FIG. 3 as well as a solder ball 13b located at four corners of the IC chip 11. This is because the thermal expansion coefficient of a semiconductor device is greatly influenced by the IC chip 11 made of silicon, so that a large joint stress is generated also in the solder ball 13b located at four corners of the IC chip 11. In the first wiring pattern 2, a region corresponding to joint portions formed on solder balls 13a at four corners of the semiconductor device 10 and a region corresponding to joint portions formed on the solder balls 13b at four corners of the IC chip 11 are constituted of an opening 8 having a large opening area and other regions are constituted of an opening 7 having a small opening area.

Thereby, a stress due to thermal expansion is reduced. Moreover, the first wiring pattern 2 is stabilized as a whole as in FIG. 3 and it is possible to stably keep the wiring impedance on the adjacent second wiring pattern 3.

Embodiment 3

Figure 5:
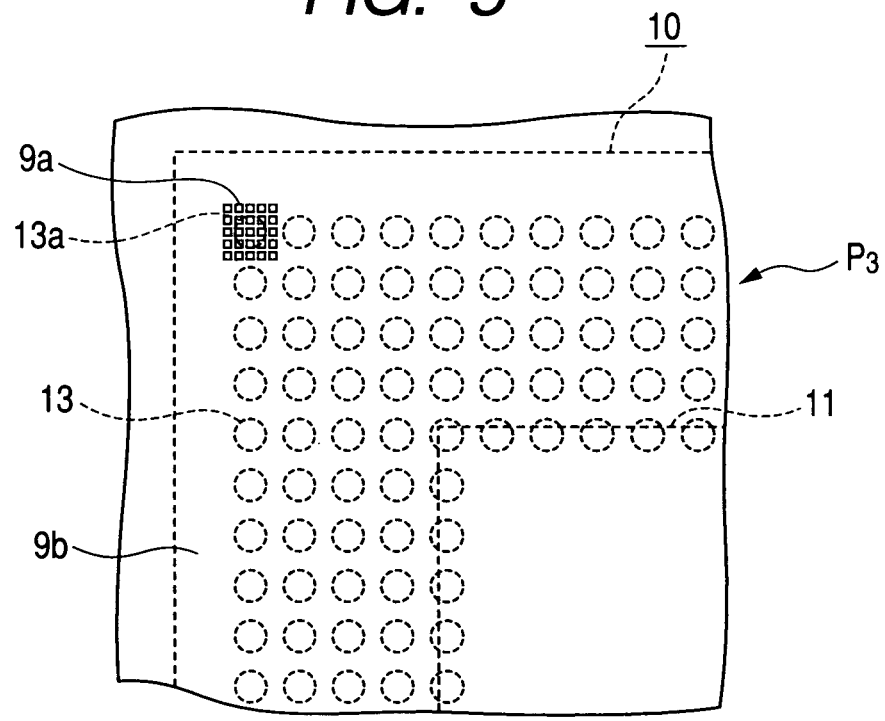
FIG. 5 is a top view showing a ground layer of a multilayer printed wiring board of Embodiment 3.

FIG. 5 is a top view showing a first wiring pattern 2 of a multilayer printed wiring board P$_3$ of the Embodiment 3. To simplify the description, the contour of a semiconductor device 10, contour of an IC chip 11, and positions of solder balls 13a are shown by a dotted line. Rectangular openings are formed on the first wiring pattern 2 in the form of a mesh.

In FIG. 5, a portion at which a joint portion to generate a maximum stress due to thermal expansion is formed is a solder ball located at four corners of the semiconductor device 10 similarly to FIG. 3. In FIG. 5, in the first wiring pattern 2, a mesh opening 8 formed by a plurality of rectangular openings 9a is formed only on a portion corresponding to solder balls located at four corners of the semiconductor device 10. The other regions are constituted of a solid ground pattern 9b.

Thereby, a stress due to thermal expansion is reduced. Moreover, by forming the rectangular opening 9a into a fine mesh pitch, it is possible to reduce the difference in copper ratio for unit area compared to the case of a copper-foil solid portion 9b. Therefore, the first wiring pattern 2 is stabilized as a whole and it is possible to stably keep the wiring impedance on the adjacent second wiring pattern 3.

Embodiment 4

Figure 6:
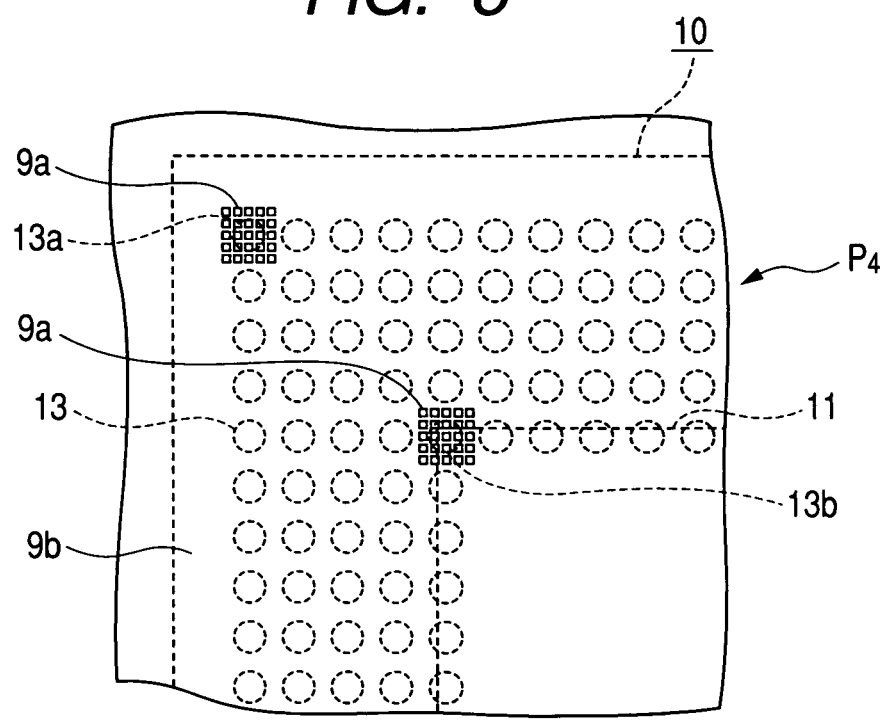
FIG. 6 is a top view showing a ground layer of a multilayer printed wiring board of Embodiment 4.

FIG. 6 is a top view showing a first wiring pattern 2 of a multilayer printed wiring board P$_4$ of Embodiment 4. To simplify the description, the contour of a semiconductor device 10, contour of an IC chip 11, and positions of solder balls 13 are shown by a dotted line. Rectangular openings are formed on the first wiring pattern 2 in the form of a mesh.

In FIG. 6, a joint portion where a maximum stress due to thermal expansion is generated is not only solder balls 13a located at four corners of the arrayed solder ball of the semiconductor device 10 shown in FIG. 5 but also solder balls 13b located at four corners of the IC chip 11. This is because the thermal expansion coefficient of the semiconductor device is greatly influenced by the IC chip 11 made of silicon, so that a large joint stress is generated also in the solder balls 13b located at four corners of the IC chip 11. In the first wiring pattern 2, a rectangular mesh opening 9a is formed on the solder balls 13a at four corners of the semiconductor device 10 and the region corresponding to joint portions formed at solder balls 13b at four corners of the IC chip 11.

Thereby, a stress due to thermal expansion is reduced. Moreover, similarly to FIG. 5, the first wiring 2 is stabilized as a whole and it is possible to stably keep the wiring impedance on the adjacent second wiring pattern 3.

According to the present invention, it is possible to reduce only the joint stress generated in a solder ball to which a maximum stress is applied due to the difference between thermal expansion coefficients among a plurality of solder balls for connecting a semiconductor device with a multilayer printed wiring board. That is, it is possible to reduce only the thermal expansion coefficient of a predetermined portion of a ground layer of an inner layer of the multilayer printed wiring board corresponding to a solder ball to which a maximum stress is applied. Moreover, at the same time, it is possible to keep small the variation of the impedance of a signal wiring of the multilayer printed wiring board and to secure high-speed stable electric signal propagation characteristics.

This application claims priority from Japanese Patent Application Nos. 2004-156991 filed on May 27, 2004 and 2005-141087 filed on May 13, 2005, which are hereby incorporated by reference herein.

What is claimed is:

1. A multilayer printed circuit board on which a semiconductor device is mounted through a plurality of solder points comprising:
    a plurality of laminated resin layers;
    a plurality of wiring pattern layers formed on an interfacial surface of the plurality of resin layers; and
    a plurality of lands which are formed on an outermost layer of the plurality of resin layers and on which the plurality of solder points are provided,
    wherein at least one of the plurality of wiring pattern layers is an opening pattern layer on which a plurality of openings are formed in the form of a mesh,
    wherein the plurality of lands are formed in the form of an array and the solder points on which stress is concentrated are located at four corners of the arrayed lands; and
    wherein the stress is concentrated due to thermal deformation of the semiconductor device and thermal deformation of the multilayer printed circuit board.

2. A multilayer printed circuit board on which a semiconductor device is mounted through a plurality of solder points comprising:
    a plurality of laminated resin layers;
    a plurality of wiring pattern layers formed on an interfacial surface of the plurality of resin layers; and
    a plurality of lands which are formed on an outermost layer of the plurality of resin layers and on which the plurality of solder points are provided,
    wherein at least one of the plurality of wiring pattern layers is an opening pattern layer on which a plurality of openings are formed in the form of a mesh,
    wherein the semiconductor device includes an IC chip sealed in a package and the plurality of lands are formed in the form of an array, and the solder points on which stress is concentrated is located at four corners of the IC chip, and
    wherein the stress is concentrated due to thermal deformation of the semiconductor device and thermal deformation of the multilayer printed circuit board.

3. A multilayer printed circuit board on which a semiconductor device is mounted through a plurality of solder points comprising:

a plurality of laminated resin layers;

a plurality of wiring pattern layers formed on an interfacial surface of the plurality of resin layers; and a plurality of lands which are formed on an outermost layer of the plurality of resin layers and on which the plurality of solder points are provided, wherein at least one of the plurality of wiring pattern layers is an opening pattern layer on which a plurality of openings are formed in the form of a mesh, wherein the semiconductor device includes an IC chip sealed in a package and the plurality of lands are formed in the form of an array, and the solder points on which stress is concentrated are located at four corners of the arrayed lands and four corners of the IC chip, and wherein the stress is concentrated due to thermal deformation of the semiconductor device and thermal deformation of the multilayer printed circuit board.

* * * * *

UNITED STATES PATENT AND TRADEMARK OFFICE
CERTIFICATE OF CORRECTION

PATENT NO. : 7,368,819 B2  Page 1 of 1
APPLICATION NO. : 11/134426
DATED : May 6, 2008
INVENTOR(S) : Yasuhiro Sawada It is certified that error appears in the above-identified patent and that said Letters Patent is hereby corrected as shown below:

COLUMN 1:
      Line 60, "shape" should read -- shape of --.

COLUMN 2:
      Line 41, "on a" should read -- on an --.

COLUMN 6:
      Line 59, "is located" should read -- are located --.

Signed and Sealed this

Twenty-third Day of September, 2008

JON W. DUDAS
*Director of the United States Patent and Trademark Office*